(12) United States Patent
Koshisaka et al.

(10) Patent No.: US 8,812,938 B2
(45) Date of Patent: Aug. 19, 2014

(54) CODING APPARATUS, CODING METHOD, DECODING APPARATUS, DECODING METHOD, PROGRAM AND TRANSMISSION SYSTEM

(75) Inventors: Naohiro Koshisaka, Hokkaido (JP);
Tatsuo Shinbashi, Tokyo (JP);
Kazuhisa Funamoto, Kanagawa (JP);
Hideyuki Matsumoto, Tokyo (JP);
Hiroshi Shiroshita, Kanagawa (JP);
Kenichi Maruko, Kanagawa (JP);
Tatsuya Sugioka, Tokyo (JP)

(73) Assignee: Sony Corporation, Tokyo (JP)

( * ) Notice: Subject to any disclaimer, the term of this patent is extended or adjusted under 35 U.S.C. 154(b) by 158 days.

(21) Appl. No.: 13/277,652

(22) Filed: Oct. 20, 2011

(65) Prior Publication Data

US 2012/0124455 A1    May 17, 2012

(30) Foreign Application Priority Data

Nov. 12, 2010   (JP) ................................ 2010-253832

(51) Int. Cl.
*H03M 13/00* (2006.01)
*H03M 13/29* (2006.01)
(52) U.S. Cl.
CPC ...... *H03M 13/6502* (2013.01); *H03M 13/2927* (2013.01); *H03M 13/2915* (2013.01)
USPC ............ 714/781; 714/752; 714/755; 714/758
(58) Field of Classification Search
USPC .................................. 714/752, 755, 758, 781
See application file for complete search history.

(56) References Cited

U.S. PATENT DOCUMENTS

| 2001/0003208 | A1* | 6/2001 | Wan | 714/800 |
| 2008/0065971 | A1* | 3/2008 | Betts | 714/800 |
| 2010/0318875 | A1* | 12/2010 | Xu et al. | 714/752 |
| 2011/0060959 | A1* | 3/2011 | Xu et al. | 714/752 |

FOREIGN PATENT DOCUMENTS

| JP | 11-215136 | 8/1999 |
| JP | 2001-045012 | 2/2001 |
| JP | 2007-088875 | 4/2007 |
| JP | 2009-049642 | 3/2009 |

OTHER PUBLICATIONS

"Transmission System for Digital Terrestrial Television Broadcasting", ARIB STD-B31 Ver1.9, Association of Radio Industries and Businesses, Revised: Jul. 15, 2010, 392 Pages (with English Translation).
Klaus-Peter Deyring, "High Speed Serialized AT Attachment Revision 1.0a", Serial ATA, Jan. 7, 2003, 311 Pages.
U.S. Appl. No. 13/765,963, filed Feb. 13, 2013, Matsumoto, et al.
Office Action issued on Jun. 17, 2014 in Japanese Patent Application No. 2010-253832.

* cited by examiner

*Primary Examiner* — Sam Rizk
(74) *Attorney, Agent, or Firm* — Oblon, Spivak, McClelland, Maier & Neustadt, L.L.P.

(57) ABSTRACT

Disclosed herein is a coding apparatus, including: a calculation section adapted to calculate, based on information of a transmission object, a linear code to be used for error detection of the information; a production section adapted to produce coded data including a plurality of sets of the information and the linear code calculated by the calculation section; and a transmission section adapted to transmit the coded data to a reception apparatus.

10 Claims, 16 Drawing Sheets

F I G . 1
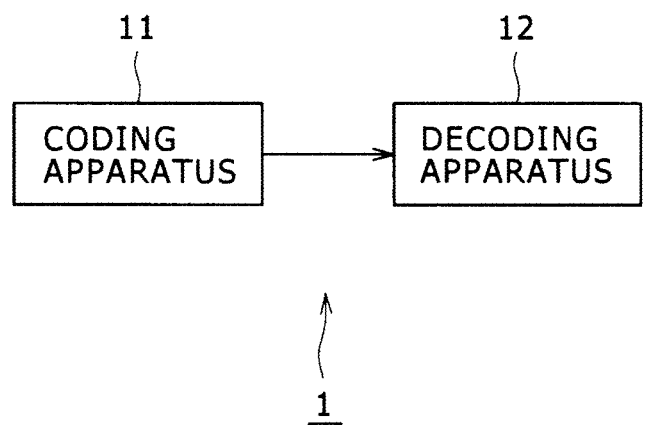

FIG.12

| ERROR DETECTION RESULT<br>○ : NO ERROR DETECTED<br>× : ERROR DETECTED | | DATA COMPARISON RESULT<br>○ : COINCIDENT<br>× : INCOINCIDENT<br>— : IGNORED | DECODING RESULT<br>○ : DECODING SUCCEEDED<br>× : DECODING FAILED | OUTPUT INFORMATION |
|---|---|---|---|---|
| SET 1 | SET 2 | SET1-SET2 | | |
| 1 ○ | ○ | ○ | ○ | EITHER INFORMATION 1 OR INFORMATION 2 |
| 2 ○ | ○ | × | × | IGNORED |
| 3 ○ | × | — | ○ | INFORMATION 1 |
| 4 × | ○ | — | ○ | INFORMATION 2 |
| 5 × | × | — | × | IGNORED |

FIG.14

| | ERROR DETECTION RESULT ○: NO ERROR DETECTED ×: ERROR DETECTED | | | DATA COMPARISON RESULT ○: COINCIDENT ×: INCOINCIDENT —: IGNORED | | | DECODING RESULT ○: DECODING SUCCESS ×: DECODING FAILED | OUTPUT INFORMATION |
|---|---|---|---|---|---|---|---|---|
| | SET1 | SET2 | SET3 | SET1-SET2 | SET2-SET3 | SET1-SET3 | | |
| 1 | ○ | ○ | ○ | ○ | ○ | ○ | ○ | EITHER INFORMATION 1, INFORMATION 2 OR INFORMATION 3 |
| 2 | ○ | ○ | ○ | × | × | ○ | ○ | EITHER INFORMATION 1 OR INFORMATION 3 |
| 3 | ○ | ○ | ○ | ○ | × | × | ○ | EITHER INFORMATION 1 OR INFORMATION 2 |
| 4 | ○ | ○ | ○ | × | ○ | × | ○ | EITHER INFORMATION 2 OR INFORMATION 3 |
| 5 | ○ | ○ | × | ○ | × | × | × | IGNORED |
| 6 | ○ | ○ | × | × | — | — | ○ | EITHER INFORMATION 1 OR INFORMATION 2 |
| 7 | ○ | × | ○ | — | — | ○ | × | IGNORED |
| 8 | ○ | × | ○ | — | — | ○ | ○ | EITHER INFORMATION 1 OR INFORMATION 3 |
| 9 | ○ | × | ○ | — | — | × | × | IGNORED |
| 10 | × | ○ | ○ | — | ○ | — | ○ | EITHER INFORMATION 2 OR INFORMATION 3 |
| 11 | × | ○ | ○ | — | × | — | × | IGNORED |
| 12 | ○ | × | × | — | — | — | ○ | INFORMATION 1 |
| 13 | × | ○ | × | — | — | — | ○ | INFORMATION 2 |
| 14 | × | × | ○ | — | — | — | ○ | INFORMATION 3 |
| 15 | × | × | × | — | — | — | × | IGNORED |

FIG.15

| | ERROR DETECTION RESULT ○: NO ERROR DETECTED ×: ERROR DETECTED | | | DATA COMPARISON RESULT ○: COINCIDENT ×: INCOINCIDENT —: IGNORED | | | | DECODING RESULT ○:DECODING SUCCESS ×:DECODING FAILED | OUTPUT INFORMATION |
|---|---|---|---|---|---|---|---|---|---|
| | SET1 | SET2 | SET3 | SET1-SET2 | SET2-SET3 | SET1-SET3 | | | |
| 1 | ○ | ○ | ○ | ○ | ○ | ○ | | ○ | EITHER INFORMATION 1,INFORMATION 2 OR INFORMATION 3 |
| 2 | ○ | ○ | ○ | × | × | ○ | | ○ | EITHER INFORMATION 1 OR INFORMATION 3 |
| 3 | ○ | ○ | ○ | ○ | × | × | | ○ | EITHER INFORMATION 1 OR INFORMATION 2 |
| 4 | ○ | ○ | ○ | × | ○ | × | | ○ | EITHER INFORMATION 2 OR INFORMATION 3 |
| 5 | ○ | ○ | ○ | × | × | × | | × | IGNORED |
| 6 | ○ | ○ | × | ○ | — | — | | ○ | EITHER INFORMATION 1 OR INFORMATION 2 |
| 7 | ○ | ○ | × | × | — | — | | × | IGNORED |
| 8 | ○ | × | ○ | — | — | ○ | | ○ | EITHER INFORMATION 1 OR INFORMATION 3 |
| 9 | ○ | × | ○ | — | — | × | | × | IGNORED |
| 10 | × | ○ | ○ | — | ○ | — | | ○ | EITHER INFORMATION 2 OR INFORMATION 3 |
| 11 | × | ○ | ○ | — | × | — | | × | IGNORED |
| 12 | ○ | × | × | — | — | — | | × | IGNORED |
| 13 | × | ○ | × | — | — | — | | × | IGNORED |
| 14 | × | × | ○ | — | — | — | | × | IGNORED |
| 15 | × | × | × | — | — | — | | × | IGNORED |

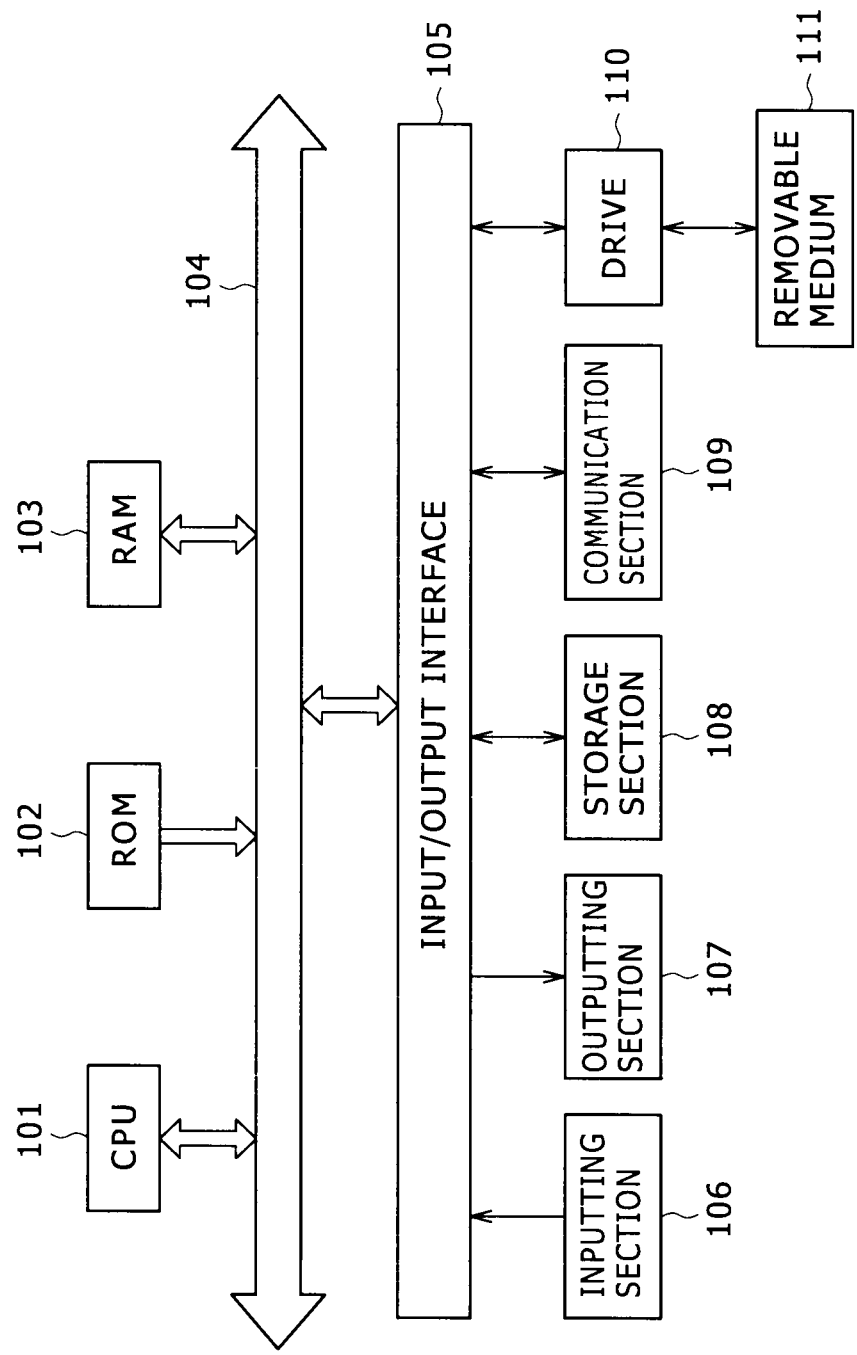

CODING APPARATUS, CODING METHOD, DECODING APPARATUS, DECODING METHOD, PROGRAM AND TRANSMISSION SYSTEM

BACKGROUND

This technology relates to a coding apparatus, a coding method, a decoding apparatus, a decoding method, a program and a transmission system, and more particularly to a technique for correcting an error of information.

Roughly speaking, two methods are available for correction of an error of information which appears upon transmission of the information from one apparatus to a different apparatus.

According to the first method, a transmission side apparatus transmits information with an error correction code added thereto. Meanwhile, a reception side apparatus utilizes the information and the error correction code to carry out error correction arithmetic operation and corrects, when an error is detected, the error.

According to the second method, a transmission side apparatus transmits information with an error detection code added thereto. Meanwhile, a reception side apparatus utilizes the information and the error detection code to carry out error detection arithmetic operation and issues, when an error is detected, a request to re-send a set of the information and the error detection code to the transmission side apparatus. Then, for example, if no error is detected as a result of error detection arithmetic operation carried out by the reception side apparatus using the information and the error detection code re-sent from the transmission side apparatus, then the reception apparatus notifies the transmission side apparatus that the information has been received regularly. The data transmission is completed therewith.

Digital Terrestrial Television Broadcasting Transmission System Standard ARIB STD-B3I Version 1.9 and Serial ATA: High Speed Serialized AT Attachment Revision 1.07a 7 Jan. 2003 are listed as related-art non-Patent Documents.

SUMMARY

The first method described above uses a complicated arithmetic operation process and therefore involves an error correction circuit of a large circuit scale.

The second method uses an information transmission path in the opposite direction for transmitting a re-sending request or the like from the reception side apparatus to the transmission side apparatus.

Therefore, it is desirable to provide a coding apparatus, a coding method, a decoding apparatus, a decoding method, a program and a transmission system by which an error of information can be corrected readily.

According to a first embodiment of the disclosed technology, there is provided a coding apparatus including a calculation section adapted to calculate, based on information of a transmission object, a linear code to be used for error detection of the information, a production section adapted to produce coded data including a plurality of sets of the information and the linear code calculated by the calculation section, and a transmission section adapted to transmit the coded data to a reception apparatus.

The information may be header information included in a packet. The coding apparatus further includes a packet production section adapted to add the coded data, which include a plurality of sets of the header information and the linear code, to data included in a payload to produce the packet. In this case, the transmission section transmits the packet produced by the packet production section to the reception apparatus.

Further, according to the first embodiment of the disclosed technology, there is provided a coding method, including calculating, based on information of a transmission object, a linear code to be used for error detection of the information, producing coded data including a plurality of sets of the information and the calculated linear code, and transmitting the coded data to a reception apparatus.

Furthermore, according to the first embodiment of the disclosed technology, there is provided a program for causing a computer to execute a process including calculating, based on information of a transmission object, a linear code to be used for error detection of the information, producing coded data including a plurality of sets of the information and the calculated linear code, and transmitting the coded data to a reception apparatus.

According to a second embodiment of the disclosed technology, there is provided a decoding apparatus including a reception section adapted to receive coded data transmitted thereto from a transmission apparatus and including a plurality of sets of information of a transmission object and a linear code determined by calculation based on the information and used for error detection of the information, an error detection arithmetic operation section adapted to carry out error detection arithmetic operation using the linear code for each of the sets and acquire an error detection result representative of whether or not the information in the set in which each of the linear codes is included has some error and data determined by the error detection arithmetic operation, and an error correction section adapted to carry out error correction of the information based on the error detection result of the sets and the data determined by the error detection arithmetic operation.

The error correction section may output the information after the error correction and a decoding result representative of whether or not the decoding of the coded data results in success.

The decoding apparatus may be configured such that, if the information includes a piece of information from which an error is detected and a piece of information from which no error is detected, the error correction section outputs the piece of information from which no error is detected as the information after the error correction and outputs the decoding result representing that the decoding of the coded data results in success.

The information may be header information included in a packet, and the reception section receives the packet where the coded data including a plurality of sets of the header information and the linear code are added to data placed in a payload. The decoding apparatus further includes a separation section adapted to separate the coded data included in the packet received by the reception section and the data placed in the payload from each other.

Further, according to the second embodiment of the disclosed technology, there is provided a decoding method including receiving coded data transmitted from a transmission apparatus and including a plurality of sets of information of a transmission object and a linear code determined by calculation based on the information and used for error detection of the information, carrying out error detection arithmetic operation using the linear code for each of the sets and acquiring an error detection result representative of whether or not the information in the set in which each of the linear codes is included has some error and data determined by the error detection arithmetic operation, and carrying out error correction of the information based on the error detection result of the sets and the data determined by the error detection arithmetic operation.

Furthermore, according to the second embodiment of the disclosed technology, there is provided a program for causing a computer to execute a process including receiving coded data transmitted from a transmission apparatus and including a plurality of sets of information of a transmission object and a linear code determined by calculation based on the information and used for error detection of the information, carrying out error detection arithmetic operation using the linear code for each of the sets and acquiring an error detection result representative of whether or not the information in the set in which each of the linear codes is included has some error and data determined by the error detection arithmetic operation, and carrying out error correction of the information based on the error detection result of the sets and the data determined by the error detection arithmetic operation.

According to a third embodiment of the disclosed technology, there is provided a transmission system including a coding apparatus and a decoding apparatus. The coding apparatus includes a calculation section adapted to calculate, based on information of a transmission object, a linear code to be used for error detection of the information, a production section adapted to produce coded data including a plurality of sets of the information and the linear code calculated by the calculation section, and a transmission section adapted to transmit the coded data to the decoding apparatus. The decoding apparatus includes a reception section adapted to receive the coded data transmitted thereto from the coding apparatus, an error detection arithmetic operation section adapted to carry out error detection arithmetic operation using the linear code for each of the sets and acquire an error detection result representative of whether or not the information in the set in which each of the linear codes is included has some error and data determined by the error detection arithmetic operation, and an error correction section adapted to carry out error correction of the information based on the error detection result of the sets and the data determined by the error detection arithmetic operation.

The coding apparatus and the decoding apparatus may be provided in the same apparatus.

In the first embodiment of the disclosed technology, based on information of a transmission object, a linear code to be used for error detection of the information is calculated. Then, coded data including a set of the information and the calculated linear code are produced. Further, the coded data are transmitted to the reception apparatus.

In the second embodiment of the disclosed technology, coded data transmitted from the transmission apparatus and including a plurality of sets of information of a transmission object and a linear code determined by calculation based on the information and used for error detection of the information are received. Then, error detection arithmetic operation using the linear code for each of the sets is carried out, and an error detection result representative of whether or not the information in the set in which each of the linear codes is included has some error and data determined by the error detection arithmetic operation are acquired. Further, error correction of the information is carried out based on the error detection result of the sets and the data determined by the error detection arithmetic operation.

In the third embodiment of the disclosed technology, the coding apparatus calculates, based on information of a transmission object, a linear code to be used for error detection of the information. Then, the coding apparatus produces coded data including a plurality of sets of the information and the calculated linear code, and transmits the coded data to the decoding apparatus. Meanwhile, the decoding apparatus receives the coded data transmitted thereto from the coding apparatus. Then, the decoding apparatus carries out error detection arithmetic operation using the linear code for each of the sets and acquires an error detection result representative of whether or not the information in the set in which each of the linear codes is included has some error and data determined by the error detection arithmetic operation. Further, the decoding apparatus carries out error correction of the information based on the error detection result of the sets and the data determined by the error detection arithmetic operation.

In summary, with the coding apparatus, coding method, decoding apparatus, decoding method, program and transmission system, an error of information can be corrected readily.

BRIEF DESCRIPTION OF THE DRAWINGS

FIG. 1 is a block diagram showing an example of a configuration of a transmission system according to an embodiment of the disclosed technology;

FIG. 12 is a view illustrating an example of selection of a decoding result and output information;

FIG. 14 is a view illustrating a first example of selection of a decoding result and output information;

FIG. 15 is a view illustrating a second example of selection of a decoding result and output information;

FIG. 17 is a block diagram showing an example of a configuration of a computer.

DETAILED DESCRIPTION OF THE PREFERRED EMBODIMENT

Example of Configuration of Transmission System

FIG. 1 shows an example of a configuration of a transmission system according to an embodiment of the disclosed technology.

Referring to FIG. 1, the transmission system 1 includes a coding apparatus 11 and a decoding apparatus 12. The transmission system 1 is implemented, for example, by incorporating the coding apparatus 11 and the decoding apparatus 12 in a single apparatus. However, the transmission system 1 may otherwise be implemented from a plurality of apparatus such that the coding apparatus 11 is provided in one of the apparatus while the decoding apparatus 12 is provided in the other apparatus.

Predetermined information such as video data or audio data is transmitted from the coding apparatus 11 to the decoding apparatus 12. However, no information is transmitted reversely from the decoding apparatus 12 to the coding apparatus 11. In the transmission system 1, error correction of information transmitted using such a one-way transmission line as just described is carried out by the decoding apparatus 12. The transmission line between the coding apparatus 11 and the decoding apparatus 12 may be any of a wire transmission line and a wireless transmission line. Further, transmission of information may be carried out otherwise through a recording medium such as a flash memory.

Figure 2A:
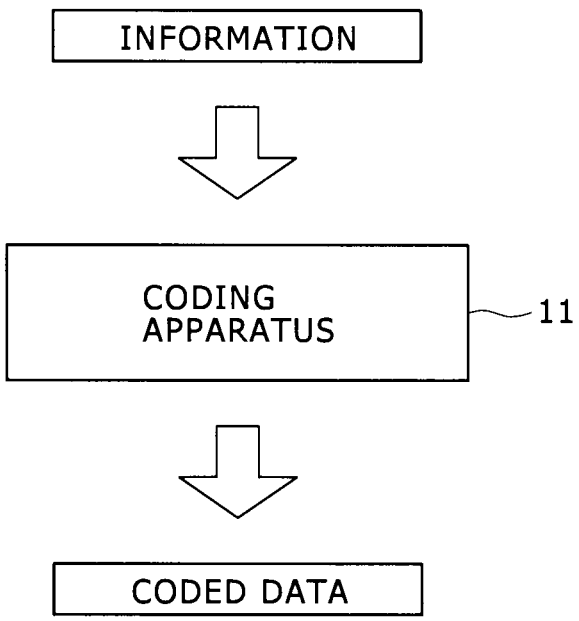
FIGS. 2A and 2B are diagrammatic views illustrating input and output data to and from a coding apparatus and a decoding apparatus, respectively.

As indicated by a solid-white arrow mark in FIG. 2A, information which is a transmission object (referred to as, simply, information, as needed), that is, an object of error correction, is inputted to the coding apparatus 11. By the coding apparatus 11, an error detection code which is a linear code is calculated based on the inputted information, and coded data formed from the information and the error detection code determined by the calculation are transmitted to the decoding apparatus 12. As hereinafter described, the coded data are configured such that a set of the same information and error detection code is disposed by a plural number of times.

As an arithmetic operation algorithm for an error detection code, for example, CRC (Cyclic Redundancy Check) can be utilized. Or, an error correction code may be added to the information in place of the error detection code. As an arithmetic operation algorithm of an error correction code, it is possible, for example, to utilize the Reed Solomon code.

Figure 2B:
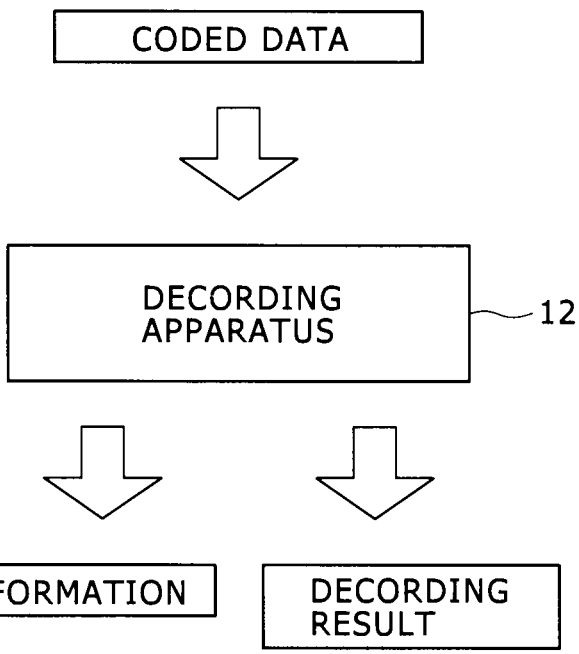

Meanwhile, as indicated by a solid-white arrow mark in FIG. 2B, coded data transmitted from the coding apparatus 11 are inputted to the decoding apparatus 12. By the decoding apparatus 12, error detection arithmetic operation for detecting an error of the information included in the coded data is carried out using the error detection code which belongs to the set same as that of the information. The error detection arithmetic operation is carried out for each set (set of the information and the error detection code) included in the coded data.

Further, by the decoding apparatus 12, correct information is estimated based on error detection results of the information of the sets and the data determined by the error detection arithmetic operation, and the information estimated correct and the decoding result are outputted. The decoding result is information representing that information which can be estimated correct has been decoded successfully from coded data, that is, that the decoding results in success, or that information which can be estimated correct has not been decoded successfully from coded data, that is, that the decoding results in failure.

A different apparatus which acquires the output of the decoding apparatus 12 carries out a predetermined process using the information representing that the decoding results in success and the information outputted from the decoding apparatus 12.

In the following, a configuration and operation of each of the coding apparatus 11 and the decoding apparatus 12 are described.

<Coding Apparatus 11>
Configuration of the Coding Apparatus 11

Figure 3:
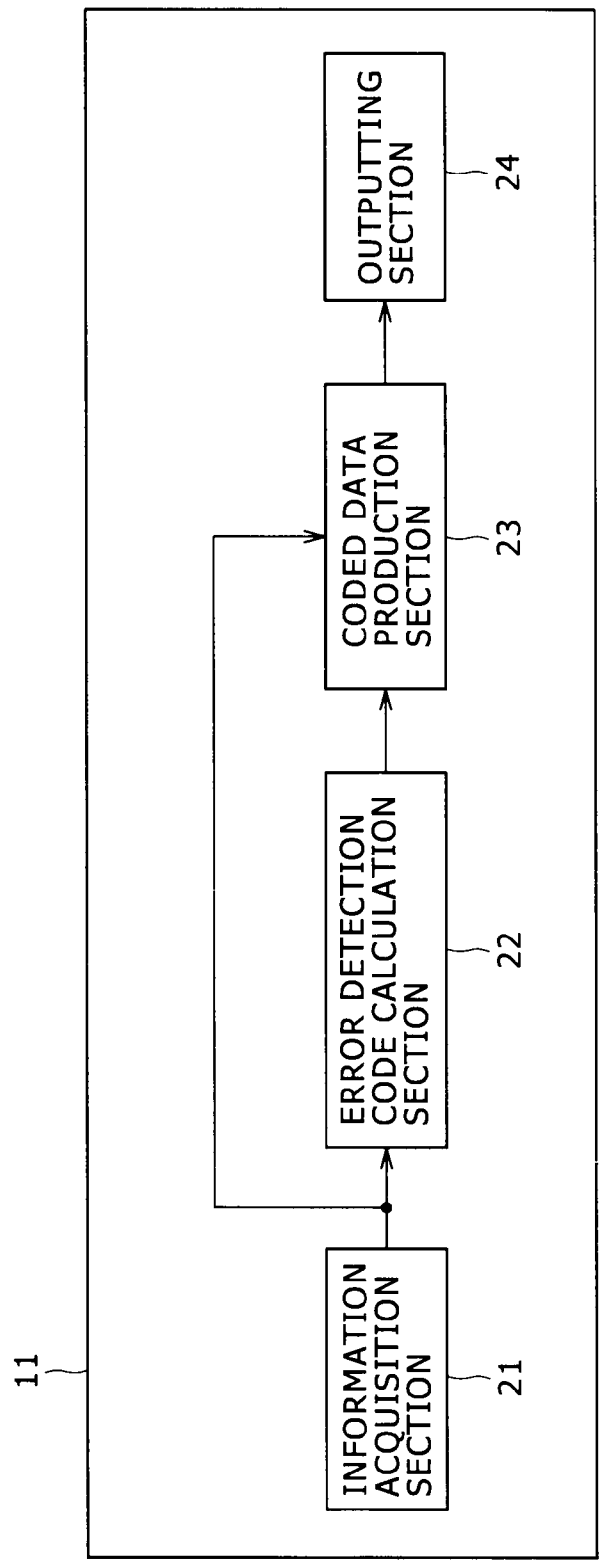
FIG. 3 is a block diagram showing an example of a configuration of the coding apparatus.

FIG. 3 shows an example of a configuration of the coding apparatus 11.

Referring to FIG. 3, the coding apparatus 11 includes an information acquisition section 21, an error detection code calculation section 22, a coded data production section 23 and an outputting section 24.

The information acquisition section 21 acquires and outputs information which makes an object of error correction. The information outputted from the information acquisition section 21 is supplied to the error detection code calculation section 22 and the coded data production section 23.

The error detection code calculation section 22 calculates an error detection code using a generating polynomial of CRC or the like based on the information supplied thereto from the information acquisition section 21. The error detection code calculation section 22 outputs the error detection code determined by the calculation to the coded data production section 23.

The coded data production section 23 produces coded data based on the information supplied thereto from the information acquisition section 21 and the error detection code supplied thereto from the error detection code calculation section 22. If an error detection code is determined based on the information by the error detection code calculation section 22 as indicated by a balloon #1 in FIG. 4, then the coded data production section 23 adds an error detection code to the information as indicated by a balloon #2 to produce a set of the information and the error detection code.

Figure 4:
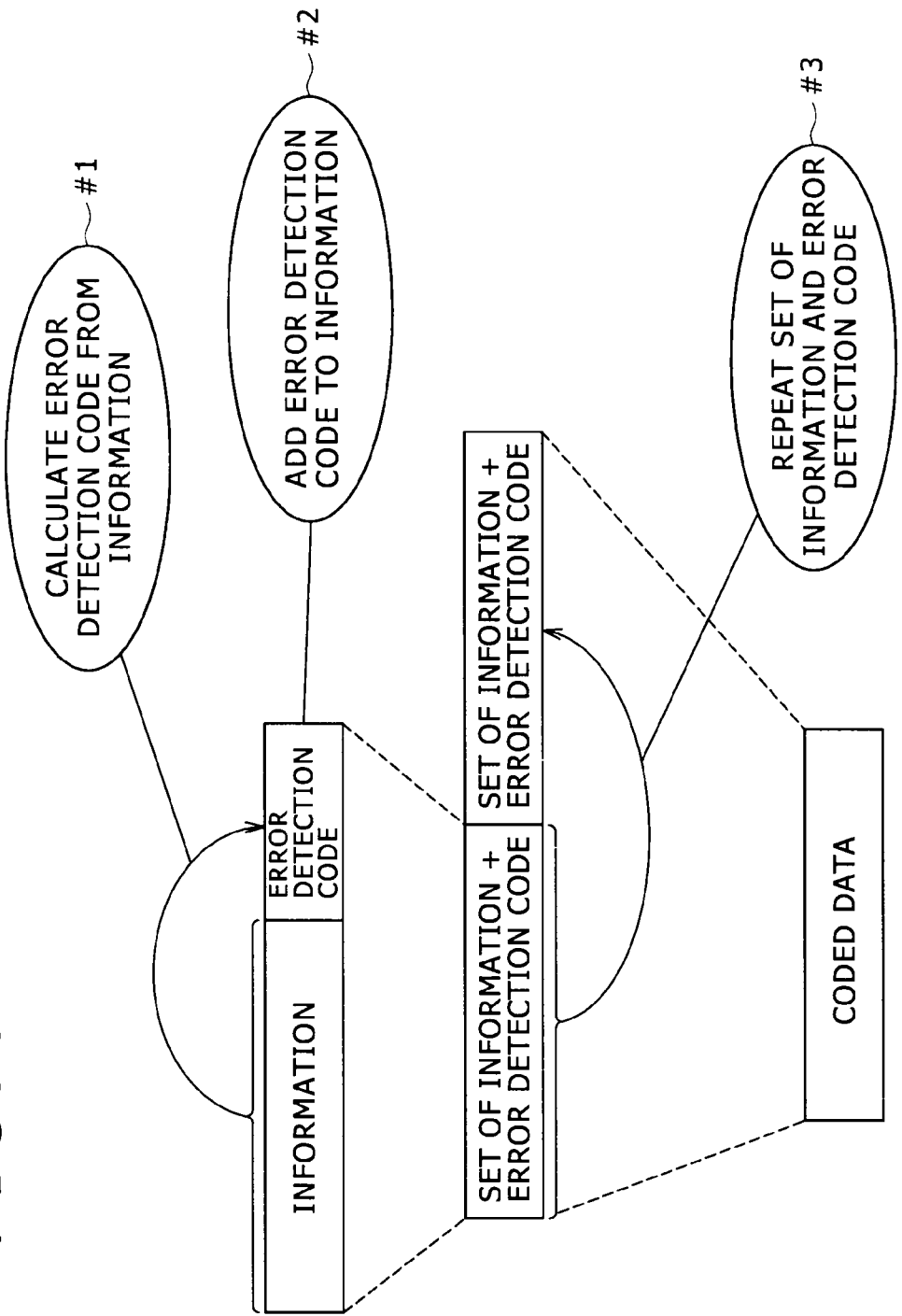
FIG. 4 is a diagrammatic view illustrating an example of production of coded data.

Further, the coded data production section 23 repetitively disposes the same set of the information and error detection code subsequently to the produced set as indicated by a balloon #3 as seen in FIG. 4 to produce coded data. In the example of FIG. 4, one coded data is produced in such a manner as to include two sets of the information and error detection code. The coded data production section 23 outputs the coded data produced in this manner to the outputting section 24.

The number of repetitions of the set of information and an error detection code is determined, for example, based on an overhead between an error correction capacity required by the transmission system 1 and the data amount. The number of repetitions may be determined in advance or may be determined dynamically.

The outputting section 24 outputs the coded data supplied thereto from the coded data production section 23 and supplies the coded data to the decoding apparatus 12.

Operation of Coding Apparatus 11

Figure 5:
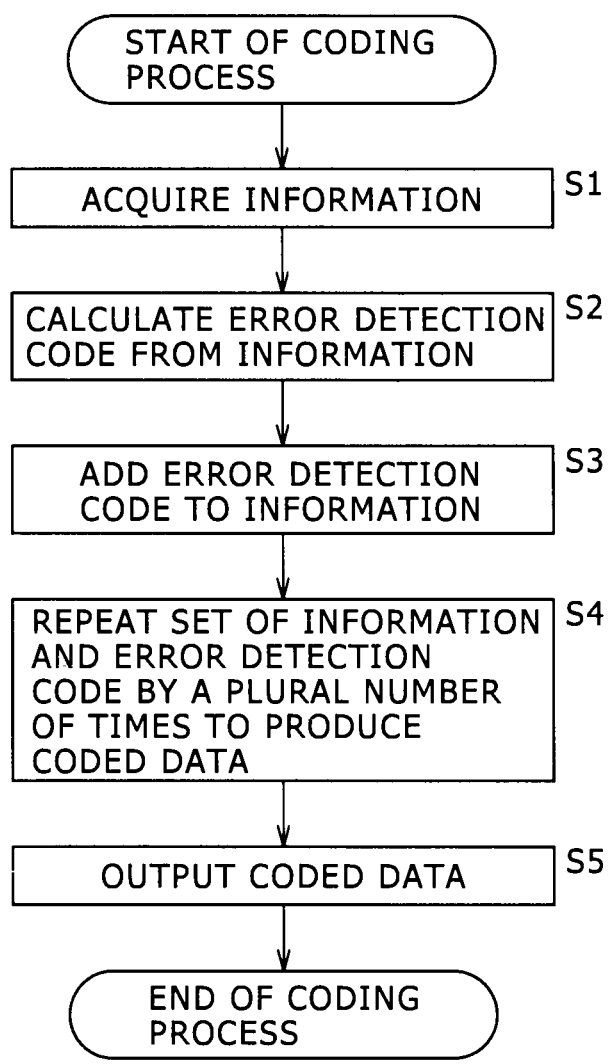
FIG. 5 is a flow chart illustrating a coding process of the coding apparatus.

Here, a coding process of the coding apparatus 11 is described with reference to a flow chart of FIG. 5. This process is started when information which makes an object of error correction is inputted to the coding apparatus 11.

At step S1, the information acquisition section 21 acquires inputted information.

At step S2, the error detection code calculation section 22 calculates an error detection code based on the information acquired by the information acquisition section 21.

At step S3, the coded data production section 23 adds the error detection code to the information to produce a set of the information and the error detection code.

At step S4, the coded data production section 23 repetitively disposes the produced set by a plural number of times to produce coded data.

At step S5, the outputting section 24 outputs the coded data produced by the coded data production section 23 and ends the processing therewith.

Format of Coded Data

A format of coded data outputted from the coding apparatus 11 is described.

Figure 6:
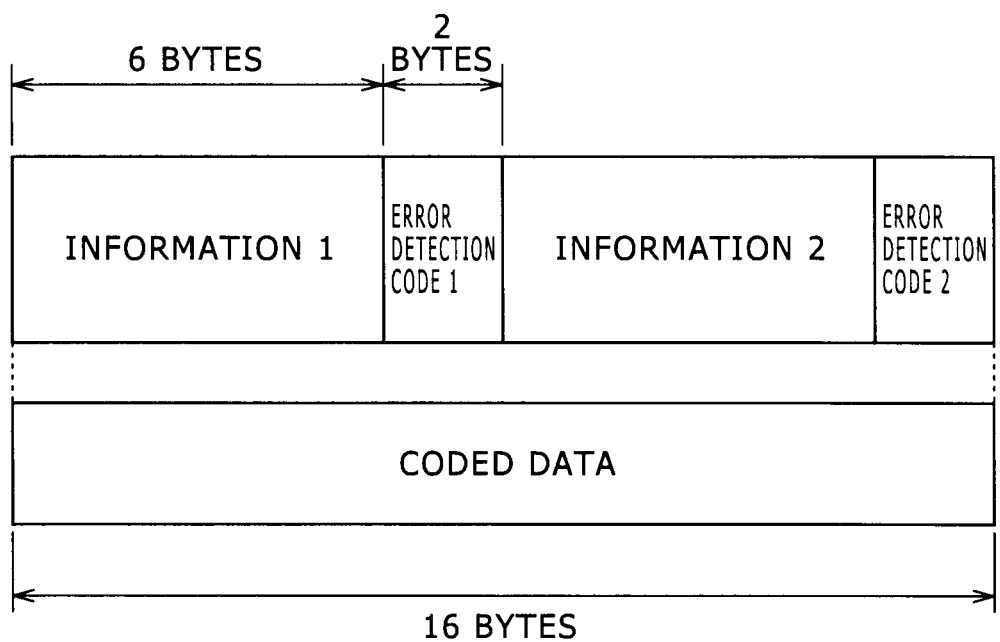
FIG. 6 is a diagrammatic view illustrating an example of a format of coded data.

FIG. 6 illustrates an example of a format in the case where the size of the information (the data amount) is 6 bytes while the size of the error detection code is 2 bytes (CRC16) and the number of repetitions is 2.

In the example of FIG. 6, the first set is configured from information 1 of 6 byte and an error detection code 1 of 2 bytes, and the second set is configured from information 2 of 6 bytes and an error detection code 2 of 2 bytes. The overall size of the coded data is 16 bytes. The information 1 and the information 2 of FIG. 6 have an equal value, and the error detection code 1 and the error detection code 2 have an equal value. The arrangement order of the information and the error detection codes is not limited to that illustrated in FIG. 6.

Figure 7:
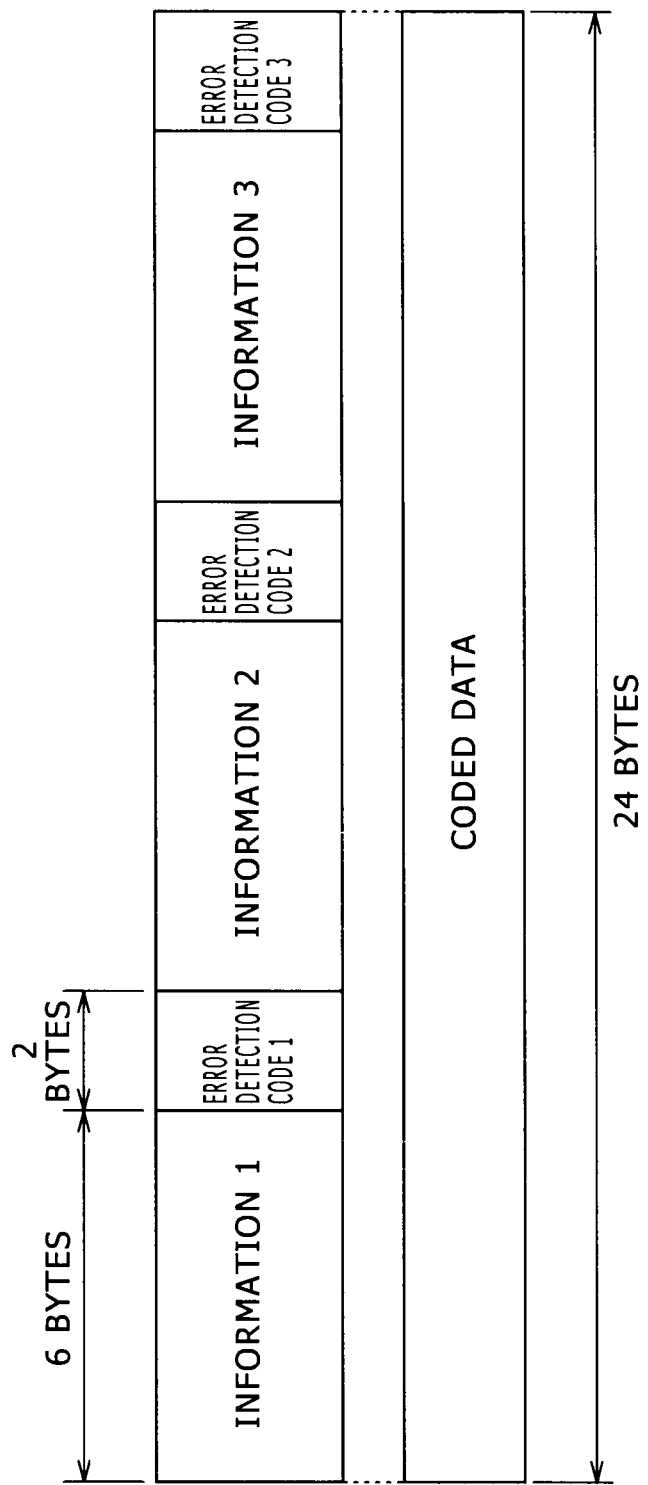
FIG. 7 is a diagrammatic view illustrating another example of a format of coded data.

FIG. 7 illustrates a format in the case where the size of information is 6 bytes and the size of an error detection code is 2 bytes while the number of repetitions is 3.

In the example of FIG. 7, the first set is configured from information 1 of 6 bytes and an error detection code 1 of 2 bytes, and the second set is configured from information 2 of 6 bytes and an error detection code 2 of 2 bytes. Further, the third set is configured from information 3 of 6 bytes and an error detection code 3 of 2 bytes. The overall size of coded data is 24 bytes. The information 1, information 2 and information 3 of FIG. 7 have an equal value, and the error detection code 1, error detection code 2 and error detection code 3 have an equal value.

Coded data having such a format as described above are transmitted to the decoding apparatus 12.

<Decoding Apparatus 12>
Configuration of Decoding Apparatus 12

Figure 8:
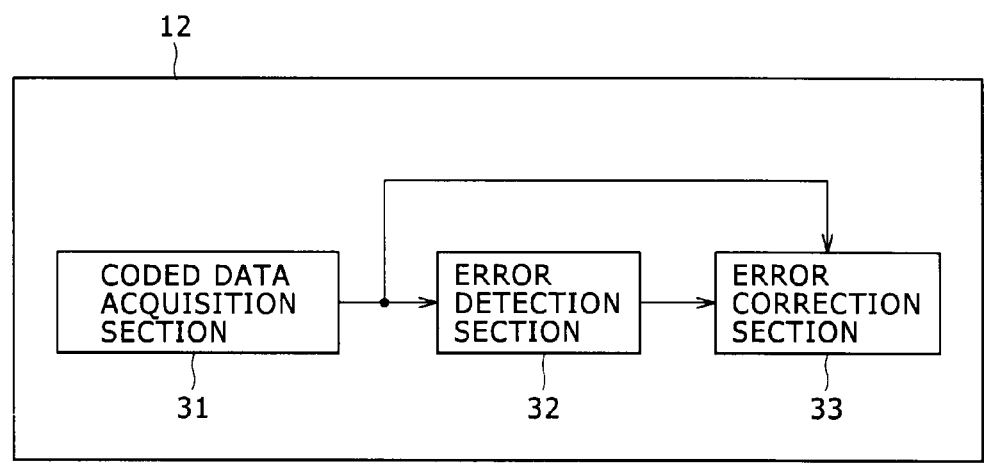
FIG. 8 is a block diagram showing an example of a configuration of the decoding apparatus.

FIG. 8 shows an example of a configuration of the decoding apparatus 12.

Referring to FIG. 8, the decoding apparatus 12 includes a coded data acquisition section 31, an error detection arithmetic operation section 32, and an error correction section 33.

The coded data acquisition section 31 acquires and outputs coded data transmitted thereto from the coding apparatus 11. The coded data outputted from the coded data acquisition section 31 are supplied to the error detection arithmetic operation section 32 and the error correction section 33.

The error detection arithmetic operation section 32 carries out error detection arithmetic operation using an error detection code for each of the sets included in the coded data supplied from the coded data acquisition section 31 to detect an error of the information of the set to which the error detection code belongs. The error detection arithmetic operation is repeated by a number of times equal to the number of sets of information and an error detection code included in the coded data.

The error detection arithmetic operation section 32 acquires an error detection result of each set acquired by the error detection arithmetic operation carried out for the set and the data determined by the error detection arithmetic operation, and outputs the acquired error detection results and data to the error correction section 33. The error detection results outputted from the error detection arithmetic operation section 32 are information representative of whether or not the information includes some error. Meanwhile, the data determined by the error detection arithmetic operation are, for example, in the case where the arithmetic operation algorithm of an error detection code is CRC, values determined by applying a generating polynomial of the CRC to the information.

Figure 9:
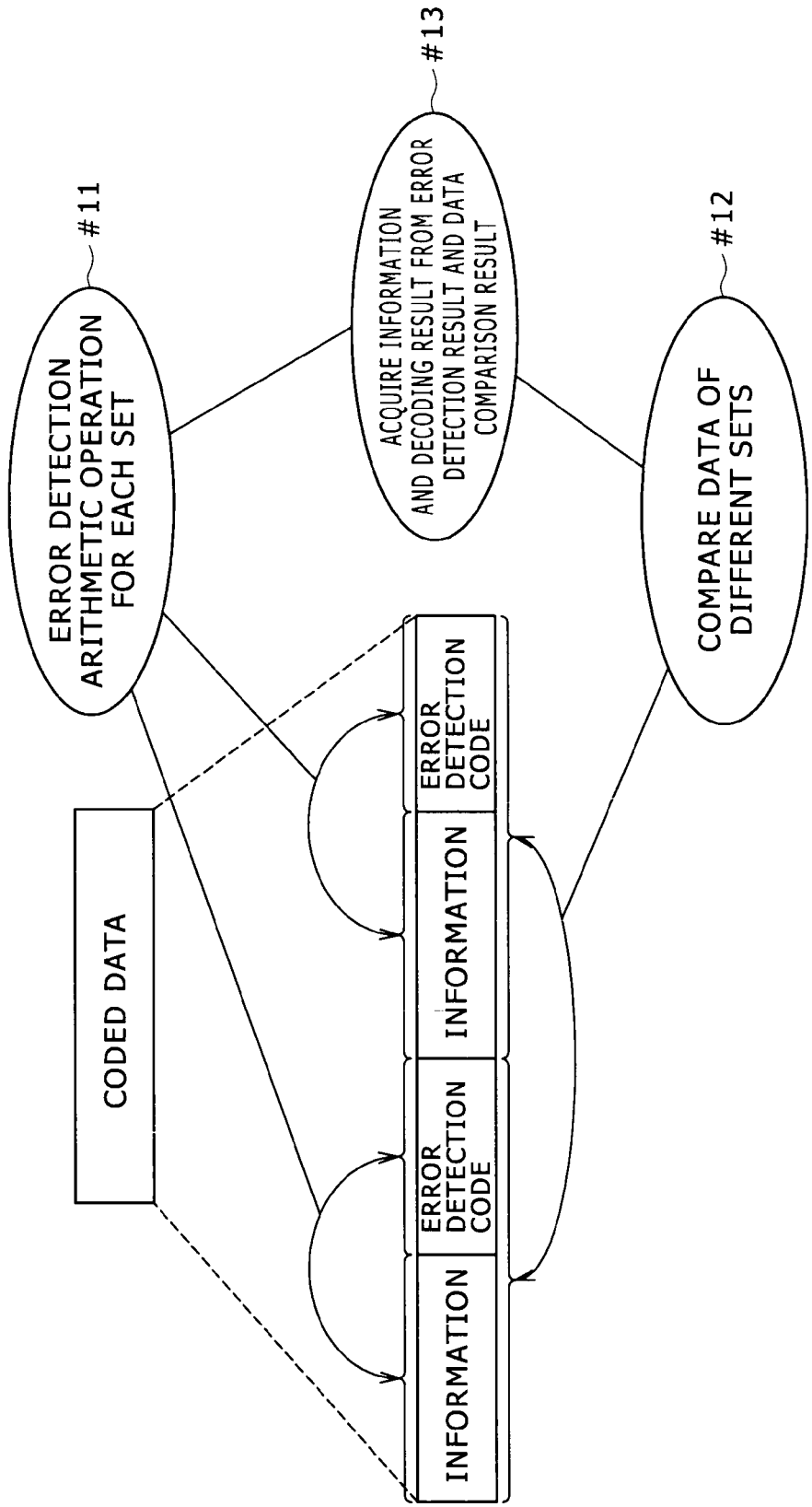
FIG. 9 is a diagrammatic view illustrating an example of decoding of coded data.

The error correction section 33 estimates error-free correct information based on the error detection results of the sets supplied from the error detection arithmetic operation section 32 and the data determined by the error detection arithmetic operation. If error detection arithmetic operation is carried out by the error detection arithmetic operation section 32 for the first set and the second set as indicated by a balloon #11 of FIG. 9, then the error correction section 33 compares the data determined by error detection arithmetic operation for the sets with each other as indicated by a balloon #12. Further, the error correction section 33 estimates correct information based on the error detection results and a result of the data comparison as indicated by a balloon #13 of FIG. 9. An algorithm for estimation of correct information is hereinafter described.

The error correction section 33 selects the information estimated correct from the coded data supplied from the coded data acquisition section 31 and outputs the selected information and decoding result.

Operation of Decoding Apparatus 12

Figure 10:
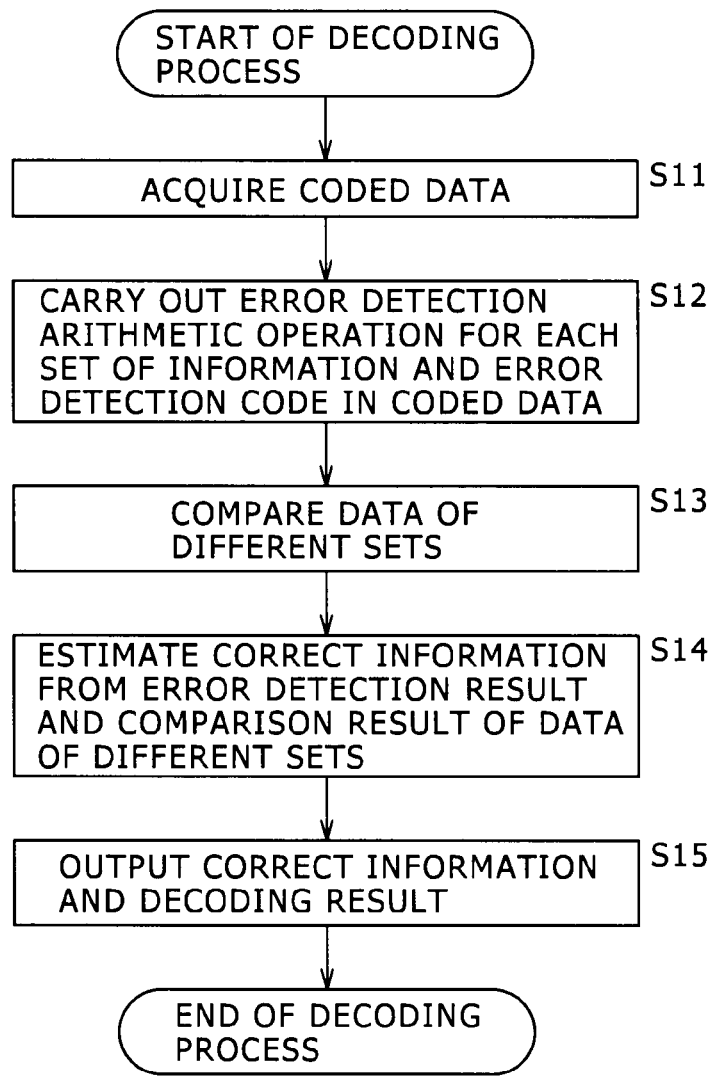
FIG. 10 is a flow chart illustrating a decoding process of the decoding apparatus.

Here, a decoding process of the decoding apparatus 12 is described with reference to a flow chart of FIG. 10. This process is started when coded data are inputted to the decoding apparatus 12.

At step S11, the coded data acquisition section 31 acquires the inputted coded data.

At step S12, the error detection arithmetic operation section 32 carries out error detection arithmetic operation for sets included in the coded data.

At step S13, the error correction section 33 compares the data determined by the error detection arithmetic operation for the sets by the error detection arithmetic operation section 32.

At step S14, the error correction section 33 estimates correct information based on the error detection results and a result of the data comparison and selects information estimated correct from among the coded data.

At step S15, the error correction section 33 outputs the selected information and decoding result and then ends the processing.

Example of Selection of Information

Figure 11:
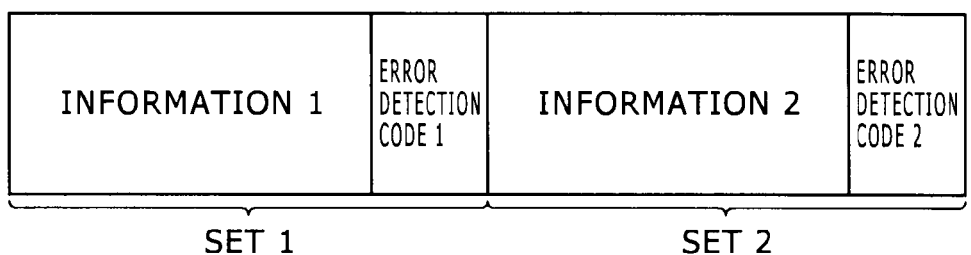
FIG. 11 is a diagrammatic view illustrating a further example of a format of coded data.

First, an example of selection of information in the case of the format of coded data in which the number of times of repetition is two as seen in FIG. 11 is described. In the following description, the first set configured from information 1 and an error detection code 1 is referred to as set 1, and the second set configured from information 2 and an error detection code 2 is referred to as set 2.

FIG. 12 illustrates decoding results and an example of selection of output information.

A solid-white round mark ○ shown in the column of the error detection result represents that no error is detected as a result of the error detection arithmetic operation, and a mark x represents that an error is detected as a result of the error detection arithmetic operation. A solid-white round mark ○ shown in the column of the data comparison result represents that a comparison result between data determined by the error detection arithmetic operation for the set 1 and data determined by the error detection arithmetic operation for the set 2 indicates coincidence, but a mark x represents that the comparison result does not indicate coincidence. The mark "-" indicates that the comparison result of the data is ignored, or in other words, the data may indicate any of coincidence and incoincidence.

A solid-white round mark ○ indicated in the column of the decoding result represents that information representative of success in decoding is selected as a decoding result, and a mark x represents that information representative of failure in decoding is selected as a decoding result. Information indicated in the column of the output information represents information which is selected as correct information and outputted from the decoding apparatus 12 together with the decoding result.

If no error is detected by the error detection arithmetic operation for both of the set 1 and the set 2 and the comparison results of the data determined by the error detection arithmetic operation exhibit coincidence as seen from a combination on the first stage, then information representative of success in decoding is selected as the decoding result. Since the same error detection arithmetic operation is carried out for the same information, if no error is found with the information, both data determined by the error detection arithmetic operation normally exhibit coincidence. Further, one of the information 1 and the information 2 is selected as output information.

If no error is detected by the error detection arithmetic operation for both of the set 1 and the set 2 while comparison results of the data determined by the error detection arithmetic operation do not exhibit coincidence as seen from a combination on the second stage, then information representative of failure in decoding is selected as the decoding result. When the information is not wrong, both data determined by the error detection arithmetic operation normally exhibit coincidence. However, the error detection arithmetic operation itself sometimes has an error. In this instance, since the error detection result is not reliable, information representative of failure in decoding is outputted. Further, whichever one of the results of the information 1 and the information 2 is outputted, the different apparatus which acquires the output information does not carry out processing (that is, ignores the acquired output information).

If no error is detected by the error detection arithmetic operation for the set 1 while an error is detected by the error detection arithmetic operation for the set 2 as seen from a combination on the third stage, then information representative of success in decoding is selected as the decoding result. Further, the information 1 from between the information 1 and the information 2 is selected as the output information. In other words, not the information 2 from which an error is detected but the information 1 from which no error is detected and which can be estimated correct is outputted. Consequently, error correction is carried out by the error correction section 33.

If an error is detected by the error detection arithmetic operation for the set 1 while no error is detected by the error detection arithmetic operation for the set 2 as seen from a combination on the fourth stage, then information representative of success in decoding is selected as the decoding result. Further, the information 2 from between the information 1 and the information 2 is selected as the output information. In other words, not the information 1 from which an error is detected but the information 2 from which no error is detected and which can be estimated correct is outputted. Consequently, error correction is carried out by the error correction section 33.

If an error is detected by the error detection arithmetic operation for both of the set 1 and the second 2 as seen from a combination on the fifth stage, then information representative of failure in decoding is selected as the decoding result. Further, the output information is ignored.

For example, in the case where the format of coded data is a format wherein the number of times of repetition is two, a decoding result and output information are selected in such a manner as described above by the error correction section 33.

Figure 13:
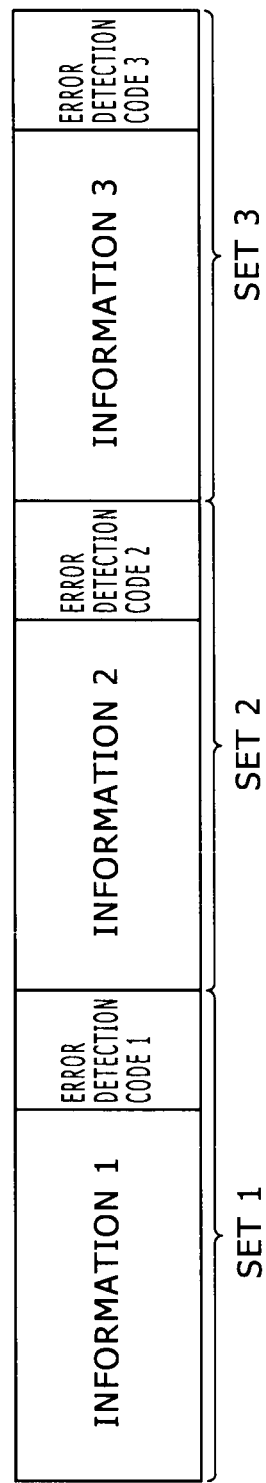
FIG. 13 is a diagrammatic view illustrating a still further example of a format of coded data.

Now, an example of selection of information in the case of the format of coded data in which the number of times of repetition is three as seen in FIG. 13 is described. In the following description, the first set configured from information 1 and an error detection code 1 is referred to as set 1 and the second set configured from information 2 and an error detection code 2 is referred to as set 2 while the third set configured from information 3 and an error detection code 3 is referred to as set 3.

FIG. 14 illustrates decoding results and a first example of selection of output information.

The table of FIG. 14 is same as the table of FIG. 12 except that a result of the set 3 is added to the column of the error detection result and a comparison result of data determined by error detection arithmetic operation for the set 2 and the set 3 and for the set 1 and the set 3 is added to the column of the data comparison result.

If no error is detected by the error detection arithmetic operation for all of the set 1, set 2 and set 3 and comparison results of the data determined by the error detection arithmetic operation exhibit coincidence as seen from a combination on the first stage, then information representative of success in decoding is selected as the decoding result. Further, one of the information 1, information 2 and information 3 is selected as output information.

If no error is detected by the error detection arithmetic operation for all of the set 1, set 2 and set 3 and only data determined by the error detection arithmetic operation for the set 1 and the set 3 exhibit coincidence, then information representative of success in decoding is selected as the decoding result. Further, one of the information 1 and the information 3 is selected as output information.

Also with regard to the other combinations of an error detection result and a data comparison result, a decoding result and output information are selected similarly as seen from the individual stages of FIG. 14. For example, if no error is detected only by the error detection arithmetic operation for the set 1 as seen from a combination at the 12th stage, then information representative of success in decoding is selected as the decoding result. Further, the information 1 is selected as the output information.

If no error is detected only by the error detection arithmetic operation for the set 2 as seen from a combination at the 13th stage, then information representative of success in decoding is selected as the decoding result. Further, the information 2 is selected as the output information.

If no error is detected only by the error detection arithmetic operation for the set 3 as seen from a combination at the 14th stage, then information representative of success in decoding is selected as the decoding result. Further, the information 3 is selected as the output information.

FIG. 15 illustrates decoding results and a second example of selection of output information in the case of a format of coded data wherein the number of times of repetition is three.

The table of FIG. 15 is same as the table of FIG. 14 except that the selected substance is different in the case of combinations at the 12th, 13th and 14th stages. In particular, in the table of FIG. 15, if no error is detected only by the error detection arithmetic operation for the set 1 as seen from a combination at the 12th stage, then information representative of failure in decoding is selected as the decoding result. Further, the output information is ignored.

If no error is detected only by the error detection arithmetic operation for the set 2 as seen from a combination at the 13th stage, then information representative of failure in decoding is selected as the decoding result. Further, the output information is ignored.

If no error is detected only by the error detection arithmetic operation for the set 3 as seen from a combination at the 14th stage, then information representative of failure in decoding is selected as the decoding result. Further, the output information is ignored.

Whether, when no error is detected only by the error detection arithmetic operation for one set, it is determined that the decoding results in success and information of the set is outputted or it is determined that the decoding results in failure is selected, for example, in accordance with the accuracy of information required by the different apparatus which acquires an output of the decoding apparatus 12 to carry out processing. If the different apparatus requires accurate information, then it is determined that the decoding results in failure, but if the different apparatus allows some error, then it is determined that the decoding results in success and the information of the set is outputted.

Also the number of sets of information and an error detection code included in one coded data are selected in accordance with the accuracy of information required by the different apparatus which acquires an output of the decoding apparatus 12 to carry out processing.

Since a decoding result and output information are selected and outputted in such a manner as described above, the decoding apparatus 12 can correct an error of information readily. In particular, error correction by the decoding apparatus 12 is carried out by detecting error-free information from among a plurality of pieces of information included in coded data using an error detection code and outputting the detected information.

Consequently, also the coding apparatus 11 need not calculate an error correction code and also the decoding apparatus 12 need not carry out error correction arithmetic operation using an error correction code. Therefore, the circuit scale can be reduced in comparison with that in an alternative case in which circuits for carrying out such error correction arithmetic operation are prepared.

Further, if, when an error of information is detected, a request to re-send the information is otherwise issued to the transmission side apparatus, then it is necessary to prepare a transmission line for transmitting the re-sending request. However, since the necessity for such re-sending request is eliminated, there is no necessity to prepare the transmission line for the reverse direction. By transmitting a plurality of same pieces of information collectively from the transmission side apparatus, a situation in which re-sending is required can be almost eliminated. Consequently, the necessity for the transmission line for the reverse direction is eliminated.

Application Example

Figure 16:
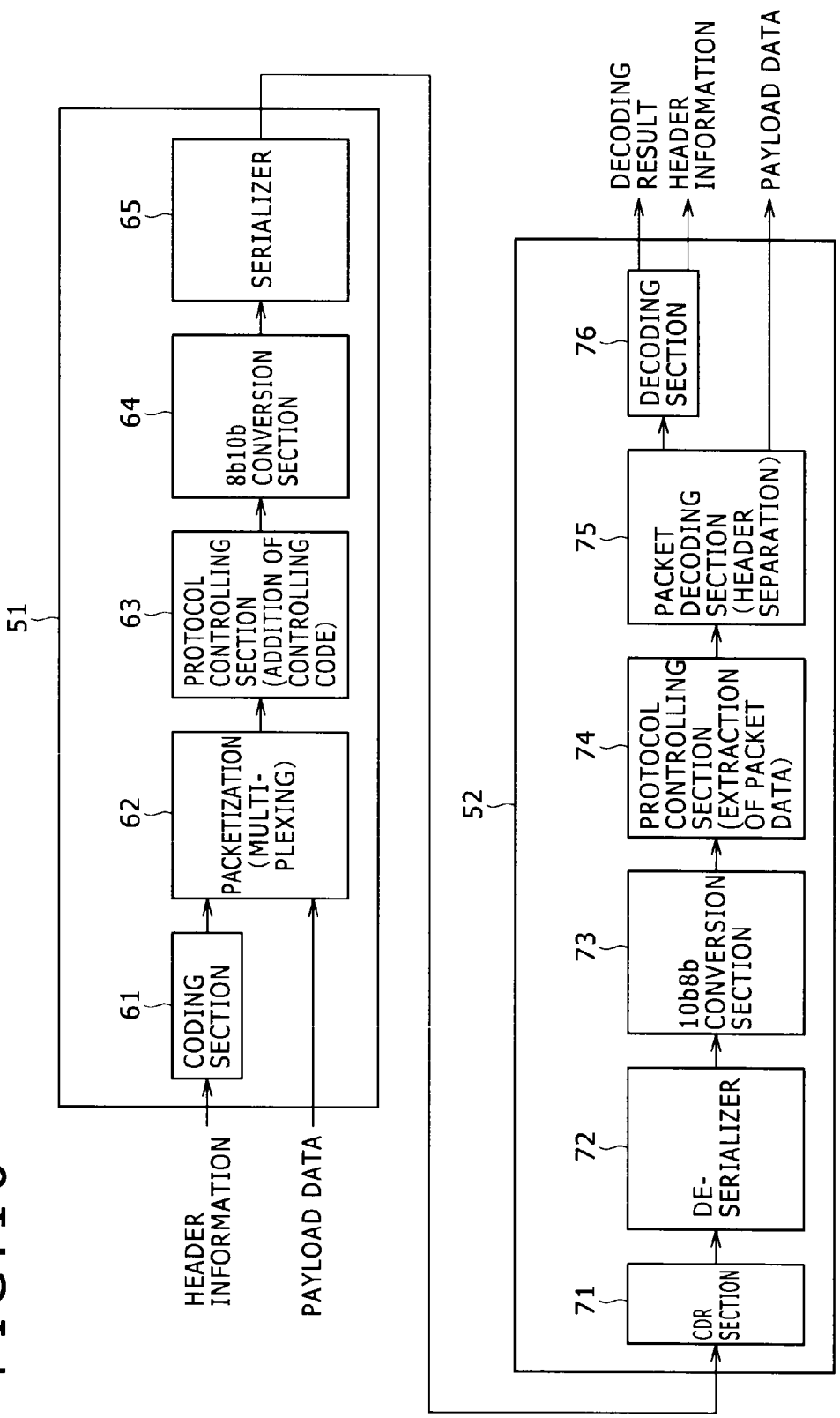
FIG. 16 is a block diagram showing an example of an application of the transmission system.

FIG. 16 shows an example of an application of the transmission system 1.

Referring to FIG. 16, the transmission system shown includes a transmission apparatus 51 and a reception apparatus 52. A packet including header information and payload data is produced by the transmission apparatus 51 and transmitted to the reception apparatus 52. The header information which is smaller in size than the payload data and for which high reliability is required is transmitted as coded data described hereinabove. Meanwhile, the payload data having a large size is transmitted in the form in which no error detection correction is carried out.

The transmission apparatus 51 includes a coding section 61, a packetization section 62, a protocol controlling section 63, an 8b10b conversion section 64, and a serializer 65. Header information supplied from the outside is inputted to the coding section 61 while payload data are inputted to the packetization section 62. Video data or the like are supplied as the payload data.

The coding section 61 produces coded data based on the inputted header information similarly to the coding apparatus 11 shown in FIG. 1. In particular, the coding section 61 calculates an error detection code based on the header information to produce a set of the header information and the error detection code. Further, the coding section 61 produces coded data which includes a plurality of sets of the header information and the error detection code and outputs the coded data to the packetization section 62.

The packetization section 62 adds the coded data supplied thereto from the coding section 61 (that is the header information after the coding) to the payload data to produce a packet and outputs the packet to the protocol controlling section 63.

The protocol controlling section 63 adds, to the packet produced by the packetization section 62, controlling codes such as a code representative of a start position of the packet and a code representative of an end position of the packet, and outputs the packet, to which the controlling codes are added, to the 8b10b conversion section 64.

The 8b10b conversion section 64 carries out 8b10b conversion for the packet (to which the controlling codes are added) supplied thereto from the protocol controlling section 63. The 8b10b conversion is a process of converting data in a unit of 8 bits which configure object data into data in a unit of 10 bits and is carried out in order to prevent the same value (1 or 0) from successively appearing by more than a predetermined number. In the case where the same value appears successively, it is difficult for an apparatus on the reception side of the data to assure bit synchronism. The 8b10b conversion section 64 outputs the packet after the 8b10b conversion to the serializer 65.

The serializer 65 transmits a signal representative of the bits of the packet supplied thereto from the 8b10b conversion section 64 to the reception apparatus 52.

The reception apparatus 52 includes a CDR (Clock Data Recovery) section 71, a deserializer 72, a 10b8b conversion section 73, a protocol controlling section 74, a packet decoding section 75 and a decoding section 76. A signal transmitted from the transmission apparatus 51 is inputted to the CDR section 71.

The CDR section 71 produces a clock based on the reception signal and outputs the reception signal and the clock signal to the deserializer 72.

The deserializer 72 samples the reception signal based on the clock signal produced by the CDR section 71 to acquire a packet transmitted from the transmission apparatus 51 and having controlling codes added thereto. The deserializer 72 outputs the acquired packet to the 10b8b conversion section 73.

The 10b8b conversion section 73 carries out 10b8b conversion of converting data in a unit of 10 bits of the packet supplied from the deserializer 72 into data in a unit of 8 bits in a corresponding relationship to the 8b10b conversion carried out by the transmission apparatus 51. The 8b10b conversion section 64 outputs the packet obtained by the 8b10b conversion to the protocol controlling section 74.

The protocol controlling section 74 removes the controlling codes added to the packet and outputs the packet having no controlling code to the packet decoding section 75.

The packet decoding section 75 separates the packet supplied thereto from the protocol controlling section 74 into coded data placed in the header of the packet and payload data placed in the payload of the packet. The packet decoding section 75 outputs the coded data to the decoding section 76 and outputs the payload data to the outside.

The decoding section 76 carries out decoding of the coded data inputted thereto similarly to the decoding apparatus 12 shown in FIG. 1. In particular, the decoding section 76 carries out error detection arithmetic operation for a set of the header information and the error detection code included in the inputted coded data. Further, the decoding section 76 estimates correct header information based on the error detection result obtained by the error detection arithmetic operation and a comparison result of data determined by the error detection arithmetic operation for each set. Then, the decoding section 76 outputs the header information estimated correct and the decoding result.

In the apparatus at a succeeding stage which acquires the output of the reception apparatus 52, a predetermined process is carried out using the header information and the payload data outputted from the reception apparatus 52 together with a decoding result representing that the decoding results in success.

In this manner, the transmission system 1 can be applied also to a transmission system which includes the transmission apparatus 51 and the reception apparatus 52 shown in FIG. 16. It is to be noted that, while it is described that, in the example of FIG. 16, transmission of a packet is carried out by a serial interface of the embedded clock type, transmission of a packet may be carried out by some other system such as a source synchronous interface or a parallel interface. Also, information for which coding and decoding are carried out as described hereinabove and which is an object of error detection correction is not limited to the header information placed in the header of a packet. For example, it is also possible to carry out such error detection correction as described hereinabove for payload data.

Example of Configuration of Computer

While the series of processes described above can be executed by hardware, it may otherwise be executed by software. In the case where the series of processes is executed by software, a program which constructs the software is installed from a program recording medium into a computer incorporated in hardware for exclusive use, a personal computer for universal use, and so forth.

FIG. 17 shows an example of a hardware configuration of a computer which executes the series of processes described hereinabove in accordance with a program.

Referring to FIG. 17, in the computer shown, a central processing unit (CPU) 101, a read only memory (ROM) 102 and a random access memory (RAM) 103 are connected to one another by a bus 104.

Further, an input/output interface 105 is connected to the bus 104. An inputting section 106 including a keyboard, a mouse and so forth, and an outputting section 107 including a display unit, a speaker and so forth are connected to the input/output interface 105. Also, a storage section 108 formed from a hard disk, a nonvolatile memory, or the like, a communication section 109 formed from a network interface or the like, and a drive 110 for driving a removable medium 111 are connected to the input/output interface 105.

In the computer configured in such a manner as described above, the CPU 101 loads a program stored, for example, in the storage section 108 into the RAM 103 through the input/output interface 105 and the bus 104 and executes the program to carry out the series of processes described above.

The program to be executed by the CPU 101 can be recorded on and provided as, for example, a removable medium 111 or can be provided through a wire or wireless transmission medium such as a local area network, the Internet or a digital broadcast, and installed into the storage section 108.

It is to be noted that the program to be executed by the computer may be of the type by which the processes are carried out in a time series in the order as described in the present specification or of the type by which the processes are executed in parallel or executed individually at necessary timings such as when the process is called.

While a preferred embodiment of the disclosed technology has been described using specific terms, such description is for illustrative purpose only, and it is to be understood that changes and variations may be made without departing from the spirit or scope of the following claims.

The present disclosure contains subject matter related to that disclosed in Japanese Priority Patent Application JP 2010-253832 filed in the Japan Patent Office on Nov. 12, 2010, the entire content of which is hereby incorporated by reference.

What is claimed is:

1. A coding apparatus, comprising:
   circuitry configured to
      calculate, based on information of a transmission object, a linear code to be used for error detection of the information;
      produce coded data including a plurality of sets of the information and the calculated linear code, each of the sets of the information and the calculated linear code having the same information and the same calculated linear code as the remaining sets; and
      transmit the coded data to a reception apparatus.

2. The coding apparatus according to claim 1, wherein the information is header information included in a packet, and
   said circuitry is further configured to:
      add the coded data, which include a plurality of sets of the header information and the linear code, to data included in a payload to produce the packet, and
      transmit the produced to the reception apparatus.

3. A coding method comprising:
   calculating, based on information of a transmission object, a linear code to be used for error detection of the information;
   producing, via a processor, coded data including a plurality of sets of the information and the calculated linear code, each of the sets of the information and the calculated linear code having the same information and the same calculated linear code as the remaining sets; and
   transmitting the coded data to a reception apparatus.

4. A non-transitory computer readable medium storing a program for causing a computer to execute a process including:
   calculating, based on information of a transmission object, a linear code to be used for error detection of the information;
   producing coded data including a plurality of sets of the information and the calculated linear code, each of the sets of the information and the calculated linear code having the same information and the same calculated linear code as the remaining sets; and
   transmitting the coded data to a reception apparatus.

5. A decoding apparatus, comprising:
   circuitry configured to:
      receive coded data transmitted thereto from a transmission apparatus and including a plurality of sets of information of a transmission object and a linear code determined by calculation based on the information and used for error detection of the information;

carry out error detection arithmetic operation using the linear code for each of the sets and acquire an error detection result representative of whether or not the information in the set in which each of the linear codes is included has some error and data determined by the error detection arithmetic operation;

carry out error correction of the information based on the error detection result of the sets and the data determined by the error detection arithmetic operation;

output the information after the error correction and a decoding result representative of whether or not the decoding of the coded data results in success; and if the information includes a piece of information from which an error is detected and a piece of information from which no error is detected:

output the piece of information from which no error is detected as the information after the error correction, and output the decoding result representing that the decoding of the coded data results in success.

6. The decoding apparatus according to claim 5, wherein the information is header information included in a packet, and said circuitry is further configured to receive the packet where the coded data including a plurality of sets of the header information and the linear code are added to data placed in a payload, and separate the coded data included in the received packet and the data placed in the payload from each other.

7. A decoding method, comprising:

receiving coded data transmitted from a transmission apparatus and including a plurality of sets of information of a transmission object and a linear code determined by calculation based on the information and used for error detection of the information;

carrying out error detection arithmetic operation, via a processor, using the linear code for each of the sets and acquiring an error detection result representative of whether or not the information in the set in which each of the linear codes is included has some error and data determined by the error detection arithmetic operation;

carrying out error correction of the information based on the error detection result of the sets and the data determined by the error detection arithmetic operation;

outputting the information after the error correction and a decoding result representative of whether or not the decoding of the coded data results in success; and if the information includes a piece of information from which an error is detected and a piece of information from which no error is detected:

outputting the piece of information from which no error is detected as the information after the error correction, and outputting the decoding result representing that the decoding of the coded data results in success.

8. A non-transitory computer readable medium storing a program for causing a computer to execute a process including:

receiving coded data transmitted from a transmission apparatus and including a plurality of sets of information of a transmission object and a linear code determined by calculation based on the information and used for error detection of the information;

carrying out error detection arithmetic operation using the linear code for each of the sets and acquiring an error detection result representative of whether or not the information in the set in which each of the linear codes is included has some error and data determined by the error detection arithmetic operation; and carrying out error correction of the information based on the error detection result of the sets and the data determined by the error detection arithmetic operation;

outputting the information after the error correction and a decoding result representative of whether or not the decoding of the coded data results in success; and if the information includes a piece of information from which an error is detected and a piece of information from which no error is detected:

outputting the piece of information from which no error is detected as the information after the error correction, and outputting the decoding result representing that the decoding of the coded data results in success.

9. A transmission system, comprising:

a coding apparatus; and a decoding apparatus;

said coding apparatus including circuitry configured to:

calculate, based on information of a transmission object, a linear code to be used for error detection of the information, produce coded data including a plurality of sets of the information and the calculated linear code, and transmit the coded data to said decoding apparatus; and said decoding apparatus including circuitry configured to:

receive the coded data transmitted thereto from said coding apparatus, carry out error detection arithmetic operation using the linear code for each of the sets and acquire an error detection result representative of whether or not the information in the set in which each of the linear codes is included has some error and data determined by the error detection arithmetic operation, and carry out error correction of the information based on the error detection result of the sets and the data determined by the error detection arithmetic operation;

output the information after the error correction and a decoding result representative of whether or not the decoding of the coded data results in success; and if the information includes a piece of information from which an error is detected and a piece of information from which no error is detected:

output the piece of information from which no error is detected as the information after the error correction, and output the decoding result representing that the decoding of the coded data results in success.

10. The transmission system according to claim 9, wherein said coding apparatus and said decoding apparatus are provided in the same apparatus.

* * * * *